(12) United States Patent
Sumikawa et al.

(10) Patent No.: US 10,012,555 B2
(45) Date of Patent: Jul. 3, 2018

(54) METHOD OF IDENTIFYING CAUSE OF SPRINGBACK AND APPARATUS OF IDENTIFYING CAUSE OF SPRINGBACK

(71) Applicant: JFE STEEL CORPORATION, Tokyo (JP)

(72) Inventors: Satoshi Sumikawa, Tokyo (JP); Akinobu Ishiwatari, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 653 days.

(21) Appl. No.: 14/406,945

(22) PCT Filed: Aug. 15, 2013

(86) PCT No.: PCT/JP2013/071950
§ 371 (c)(1),
(2) Date: Dec. 10, 2014

(87) PCT Pub. No.: WO2014/050342
PCT Pub. Date: Apr. 3, 2014

(65) Prior Publication Data
US 2015/0168240 A1 Jun. 18, 2015

(30) Foreign Application Priority Data
Sep. 26, 2012 (JP) .................................. 2012-211728

(51) Int. Cl.
*G01L 1/00* (2006.01)
*G01L 5/00* (2006.01)
(Continued)

(52) U.S. Cl.
CPC .............. *G01L 5/00* (2013.01); *B21D 22/00* (2013.01); *G06F 17/5018* (2013.01); *Y02T 10/82* (2013.01)

(58) Field of Classification Search
CPC ........ G01L 5/00; B21D 22/00; G06F 17/5018
(Continued)

(56) References Cited

U.S. PATENT DOCUMENTS

2010/0005845 A1  1/2010 Yoshida et al.

FOREIGN PATENT DOCUMENTS

| JP | A-2003-347301 | 12/2003 |
| JP | A-2008-87015  | 4/2008  |
| JP | B2-4724626    | 7/2011  |

OTHER PUBLICATIONS

Eggertsen, P.-A. et al., "On constitutive modeling for springback analysis," International Journal of Mechanical Sciences, vol. 52, (2010), pp. 804-818.
(Continued)

*Primary Examiner* — Eman Alkafawi
(74) *Attorney, Agent, or Firm* — Oliff PLC

(57) ABSTRACT

A method of identifying a cause of springback includes a step of performing a press forming analysis, a step of performing a springback analysis on the basis of information acquired by the press forming analysis, a step of dividing a shape of a press forming product acquired by the press forming analysis into a plurality of regions, a step of changing Young's modulus in a designated direction in any region of the divided regions, a step of performing the springback analysis on the press forming product whose Young's modulus is changed, a step of acquiring springback amount differences on the basis of multiple springback analysis results, and a step of identifying the cause of the springback on the basis of the acquired springback amount differences.

4 Claims, 8 Drawing Sheets

(51) Int. Cl.
*B21D 22/00* (2006.01)
*G06F 17/50* (2006.01)

(58) Field of Classification Search
USPC .......................................................... 702/42
See application file for complete search history.

(56) References Cited

OTHER PUBLICATIONS

Jun. 8, 2016 Extended Search Report issued in European Patent Application No. 13840485.0.
Sep. 1, 2015 Office Action issued in Chinese Patent Application No. 201380045725.6.
International Search Report issued in International Patent Application No. PCT/JP2013/071950 dated Nov. 19, 2013.
Mar. 31, 2015 International Preliminary Report on Patentability issued in International Patent Application No. PCT/US2013/071950.

METHOD OF IDENTIFYING CAUSE OF SPRINGBACK AND APPARATUS OF IDENTIFYING CAUSE OF SPRINGBACK

FIELD

The present invention relates to a method of identifying a cause of springback occurring in a press forming product such as an automobile part and to an apparatus of identifying a cause of springback.

BACKGROUND

Press forming is a method of processing a steel sheet, which is the target of the forming, by pressing a die to the steel sheet and transferring a shape of the die to a blank. In the press forming, a reverse phenomenon of a strain due to elastic recovery, what is called springback, is generated by a residual stress in a press forming product as driving force after the press forming product is removed from the die, and thus a problem frequently arises in that the shape of the press forming product differs from a desired shape. In recent years, particularly mainly in the automobile industry, there is a strong tendency to use a high-strength steel sheet for automotive body parts from a viewpoint of weight saving of automotive bodies, thereby causing an increase in degree of the springback. The suppression of the springback becomes a critical issue for reducing development time and costs of automobiles.

It is effective to take actions of suppressing springback by identifying a portion having residual stress having caused the occurrence of the springback and the direction of the residual stress. Patent Literature 1 describes a technique that pays attention to the residual stress in a press forming simulation with a finite element method, changes the residual stress of part of the regions of a press forming product before a die release, evaluates a springback amount calculated in its state, determines how much the residual stress in the region affects the springback, and identifies the cause of the occurrence of the springback. In the technique described in Patent Literature 1, the physical quantities changed in the part of regions may include the sheet thickness, Young's modulus, and a plasticity coefficient besides the residual stress (refer to paragraph [0031]). The technique described in Patent Literature 1 cannot directly identify the portion having the residual stress having caused the occurrence of the springback and the direction of the residual stress as described above, but can find which physical quantity in which portion indirectly affects the springback as the cause of occurrence.

CITATION LIST

Patent Literature

Patent Literature 1: Japanese Patent No. 4724626

SUMMARY

Technical Problem

However, the technique disclosed in Patent Literature 1 has the following problems. In the forming simulation, in which a material model defining deformation behaviors of the material is used, a problem arises due to a type of used material model when the residual stress is changed. Various material models have been proposed and differ from each other in treatment of a yield surface. The yield surface represents a yielding behavior of a material to which a multiaxial stress is applied. When a platy material used in press forming is treated, the yield surface is typically represented by a two-dimensional stress plane as illustrated in FIG. 11. As illustrated in FIG. 11, a material elastically deforms and thereafter yields at a stress A, and thereafter plastically deforms as the stress inside the material is increased by external force applied to the material by processing the material. In the plastic deformation, a hardening of the material is reproduced by enlarging the yield surface by an enlargement amount R as illustrated in FIG. 12 as one of developed forms of the yield surface. This is called an isotropic hardening model. The isotropic hardening model is widely used as the most classical and simplest model in the material models used for press forming analysis.

On the other hand, a model that reproduces the hardening of the material by moving the yield surface in the plastic deformation as illustrated in FIG. 13 is called a kinematic hardening model. Various kinematic hardening models have been proposed recently and have been introduced in universal finite element method software because the kinematic hardening models are relatively excellent in prediction accuracy of springback. In the kinematic hardening model, a moving amount of the center of the yield surface is represented by a back stress $\alpha$, and calculation is performed by updating this variable for each calculation step in the simulation and storing it as a history variable. The enlargement amount R of the isotropic hardening model needs no history variable because the enlargement amount R is determined by a strain generated in the material. With attention paid to the features of the material models, problems of the conventional techniques are described.

The identification of the cause of the occurrence of springback by the technique described in Patent Literature 1 with a high accurate material model using history variable, such as the kinematic hardening model, needs to change not only the residual stress but also the history variable. This is because the consistency is not maintained in numerical calculation simply by changing the residual stress and thus the calculation may crash or wrong calculation may be performed. The history variable is, however, not multiplied by a coefficient applied by the residual stress and it is also difficult to determine an appropriate coefficient. In this way, the technique described in Patent Literature 1 is unsuitable when the high accurate material model using the history variable is used.

When the stress in a certain region is set to zero as exemplified in Patent Literature 1, stress concentration occurs at the boundary with the other region, thereby causing conditions different from reality in some cases. In addition, even if the stress in a certain region is set to zero in numerical analysis, the stress balances with stresses in the other regions. As a result, the stress of the region does not always practically become zero after the springback occurs. This is thus far from the actual phenomenon and unnatural.

The reason why the sheet thickness, the Young's modulus, and the plastic coefficient (all of which are scalar values and isotropic values) are changed in the technique described in Patent Literature 1 is to indirectly find the cause of the occurrence of springback as described above, and not to identify the portion having the residual stress having caused the occurrence of springback and the direction of the residual stress. If the residual stress having caused the occurrence of springback and the direction thereof cannot be identified, then the springback suppression actions such as a die correction cannot be guided.

The present invention is made to solve the problems described above and aims to provide a method of identifying a cause of springback and an apparatus of identifying a cause of springback that can accurately identify a portion having a residual stress having caused the occurrence of springback and a direction of the residual stress.

Solution to Problem

A method of identifying a cause of springback of a press forming product according to the present invention is performed by a computer and includes: a press forming analysis step of acquiring a shape, a residual stress distribution, and a strain distribution of the press forming product before a die release by performing a press forming analysis; a first springback analysis step of acquiring a springback amount of the press forming product after the die release by performing a springback analysis on the basis of the shape, the residual stress distribution, and the strain distribution of the press forming product acquired at the press forming analysis step; a region dividing step of dividing the shape of the press forming product acquired at the press forming analysis step into a plurality of regions; a Young's modulus changing step of selecting any region of the regions of the press forming product divided at the region dividing step, and changing Young's modulus in a designated direction in the selected region; a second springback analysis step of acquiring the springback amount of the press forming product after the die release for each selected region and designated direction by performing the springback analysis on the press forming product whose Young's modulus is changed at the Young's modulus changing step on the basis of the shape, the residual stress distribution, and the strain distribution of the press forming product acquired at the press forming analysis step; a springback amount difference acquisition step of acquiring the springback amount difference between the springback amount acquired at the first springback analysis step and the springback amount for each selected region and designated direction acquired at the second springback analysis step; and a springback cause identifying step of comparing the springback amount differences acquired at the springback amount difference acquisition step with each other, and identifying a residual stress and its direction having caused the springback on the basis of a result of the comparison.

In the method of identifying a cause of springback according to the present invention, at the springback cause identifying step, all of the acquired springback amount differences are compared with each other, and the selected region and the designated direction from which a maximum springback amount difference is acquired are identified as the residual stress and its direction having caused the springback.

In the method of identifying a cause of springback according to the present invention, a relation between a stress σ and a strain ε is expressed by ε=Cσ and where $E_{xx}$ is the Young's modulus in an x direction, $E_{yy}$ is the Young's modulus in a y direction, and $E_{zz}$ is the Young's modulus in a z direction at the Young's modulus changing step and the second springback analysis step, an elastic compliance C is given by the following formula (1):

$$C = \begin{bmatrix} \frac{1}{E_{xx}} & -\frac{v_{yx}}{E_{yy}} & -\frac{v_{zx}}{E_{zz}} & 0 & 0 & 0 \\ -\frac{v_{xy}}{E_{xx}} & \frac{1}{E_{yy}} & -\frac{v_{zy}}{E_{zz}} & 0 & 0 & 0 \\ -\frac{v_{xz}}{E_{xx}} & -\frac{v_{yz}}{E_{yy}} & \frac{1}{E_{zz}} & 0 & 0 & 0 \\ 0 & 0 & 0 & \frac{1}{2G_{xy}} & 0 & 0 \\ 0 & 0 & 0 & 0 & \frac{1}{2G_{yz}} & 0 \\ 0 & 0 & 0 & 0 & 0 & \frac{1}{2G_{zx}} \end{bmatrix} \quad (1)$$

where $G_{xy}$ is the shearing modulus in the xy plane, $G_{yz}$ is the shearing modulus in the yz plane, $G_{zx}$ is the shearing modulus in the zx plane, $v_{xy}$ is the Poisson's ratio in the x direction and the y direction, $v_{yz}$ is the Poisson's ratio in the y direction and the z direction, and $v_{zx}$ is the Poisson's ratio in the z direction and the x direction, and the Young's modulus is changed at the Young's modulus changing step by changing a value of any of $E_{xx}$, $E_{yy}$, and $E_{zz}$ of formula (1).

In the method of identifying a cause of springback according to the present invention, the Young's modulus is changed at the Young's modulus changing step by increasing the value of any of $E_{xx}$, $E_{yy}$, and $E_{zz}$ of formula (1) by a factor of equal to or larger than 2 or by a factor of equal to or smaller than ½.

An apparatus of identifying a cause of springback of a press forming product according to the present invention is implemented by a computer and includes: a press forming analysis unit that acquires a shape, a residual stress distribution, and a strain distribution of the press forming product before a die release by performing a press forming analysis; a springback analysis unit that acquires springback amounts of the press forming product after the die release by performing a springback analysis on the basis of the shape, the residual stress distribution, and the strain distribution of the press forming product; a region dividing unit that divides the shape of the press forming product into a plurality of regions; a Young's modulus changing unit that selects any region of the regions of the press forming product divided by the region dividing unit and changes Young's modulus in a designated direction in the selected region; a springback amount difference acquisition unit that compares the springback amounts acquired by the springback analysis unit with each other and acquires a springback amount difference; and a springback cause identifying unit that compares multiple springback amount differences and identifies a residual stress and its direction having caused the springback on the basis of a result of the comparison.

In the apparatus of identifying a cause of springback according to the present invention, the springback cause identifying unit compares all of the acquired springback amount differences with each other and identifies the selected region and the designated direction from which a maximum springback amount difference is acquired as the residual stress and its direction having caused the springback.

In the apparatus of identifying a cause of springback according to the present invention, when a relation between a stress σ and a strain ε is expressed by ε=Cσ and where $E_{xx}$ is the Young's modulus in an x direction, $E_{yy}$ is the Young's modulus in a y direction, and $E_{zz}$ the Young's modulus in a z direction in the Young's modulus changing unit and the springback analysis unit, an elastic compliance C is given by the following formula (1):

$$C = \begin{bmatrix} \frac{1}{E_{xx}} & -\frac{v_{yx}}{E_{yy}} & -\frac{v_{zx}}{E_{zz}} & 0 & 0 & 0 \\ -\frac{v_{xy}}{E_{xx}} & \frac{1}{E_{yy}} & -\frac{v_{zy}}{E_{zz}} & 0 & 0 & 0 \\ -\frac{v_{xz}}{E_{xx}} & -\frac{v_{yz}}{E_{yy}} & \frac{1}{E_{zz}} & 0 & 0 & 0 \\ 0 & 0 & 0 & \frac{1}{2G_{xy}} & 0 & 0 \\ 0 & 0 & 0 & 0 & \frac{1}{2G_{yz}} & 0 \\ 0 & 0 & 0 & 0 & 0 & \frac{1}{2G_{zx}} \end{bmatrix} \quad (1)$$

where $G_{xy}$ is the shearing modulus in the xy plane, $G_{yz}$ is the shearing modulus in the yz plane, $G_{zx}$ is the shearing modulus in the zx plane, $v_{xy}$ is the Poisson's ratio in the x direction and the y direction, $v_{yz}$ is the Poisson's ratio in the y direction and the z direction, and $v_{zx}$ is the Poisson's ratio in the z direction and the x direction, and the Young's modulus is changed by the Young's modulus changing unit by changing a value of any of $E_{xx}$, $E_{yy}$, and $E_{zz}$ of formula (1).

In the apparatus of identifying a cause of springback according to the present invention, the Young's modulus changing unit changes the Young's modulus by increasing the value of any of $E_{xx}$, $E_{yy}$, and $E_{zz}$ of formula (1) by a factor of equal to or larger than 2 or by a factor of equal to or smaller than ½.

Advantageous Effects of Invention

In the invention, the analysis is performed by changing the Young's modulus in the designated direction in any region of the multiple regions divided from the shape of the press forming product without changing the residual stress, thereby making it possible to accurately identify the portion having the residual stress having caused the occurrence of springback and the direction of the residual stress without causing a crash in calculation or performing wrong calculation.

DESCRIPTION OF EMBODIMENTS

The technique described in Patent Literature 1 uses Young's modulus as isotropic in any direction with a scalar value. Young's modulus, however, practically differs in value in directions in a plane of a material and this property is called elastic anisotropy. As a result of intensive studies by the inventors of the invention with attention paid to the elastic anisotropy, a knowledge was obtained that calculating a springback amount by changing the Young's modulus in a certain direction in a certain region enables a portion having a residual stress having caused the occurrence of springback and the direction of the residual stress to be identified.

On this point, a case is exemplarily described in which an analytical model of a certain part is prepared, a press forming analysis is performed on the prepared analytical model to obtain stress conditions and the like before a die release, and then a springback analysis is performed to obtain the springback amount after the die release. It is assumed that the Young's modulus in the x direction of a rectangular coordinate system of part of the regions of the analytical model is hypothetically set to a large value in the analytical model before the die release. The Young's modulus is defined as the ratio of stress to strain. The change of the Young's modulus in the x direction in a certain region to a large value means that a strain amount (springback amount) in the x direction generated by the release of a predetermined residual stress in the x direction in the region is smaller than the strain amount (springback mount) when the Young's modulus is not changed.

A plurality of springback amount differences, each of which is the difference between the springback amount obtained from the springback analysis on the analytical model in which the Young's modulus is changed and the springback analysis on the analytical model in which the Young's modulus is not changed, are acquired by changing the regions and directions where the Young's modulus is changed, and then the acquired springback amount differences are compared with each other. This makes it possible to determine which direction of the residual stress in which region greatly contributes to the springback.

The following describes a method of identifying a cause of springback according to an embodiment of the invention conceived on the basis of the technical idea described above.

The method of identifying a cause of springback according to the embodiment of the invention is performed by an apparatus such as a personal computer (PC) executing a program. A structure of the apparatus (hereinafter described as a "springback cause identifying apparatus 1") is described on the basis of the block diagram illustrated in FIG. 2.

[Springback Cause Identifying Apparatus]

Figure 2:
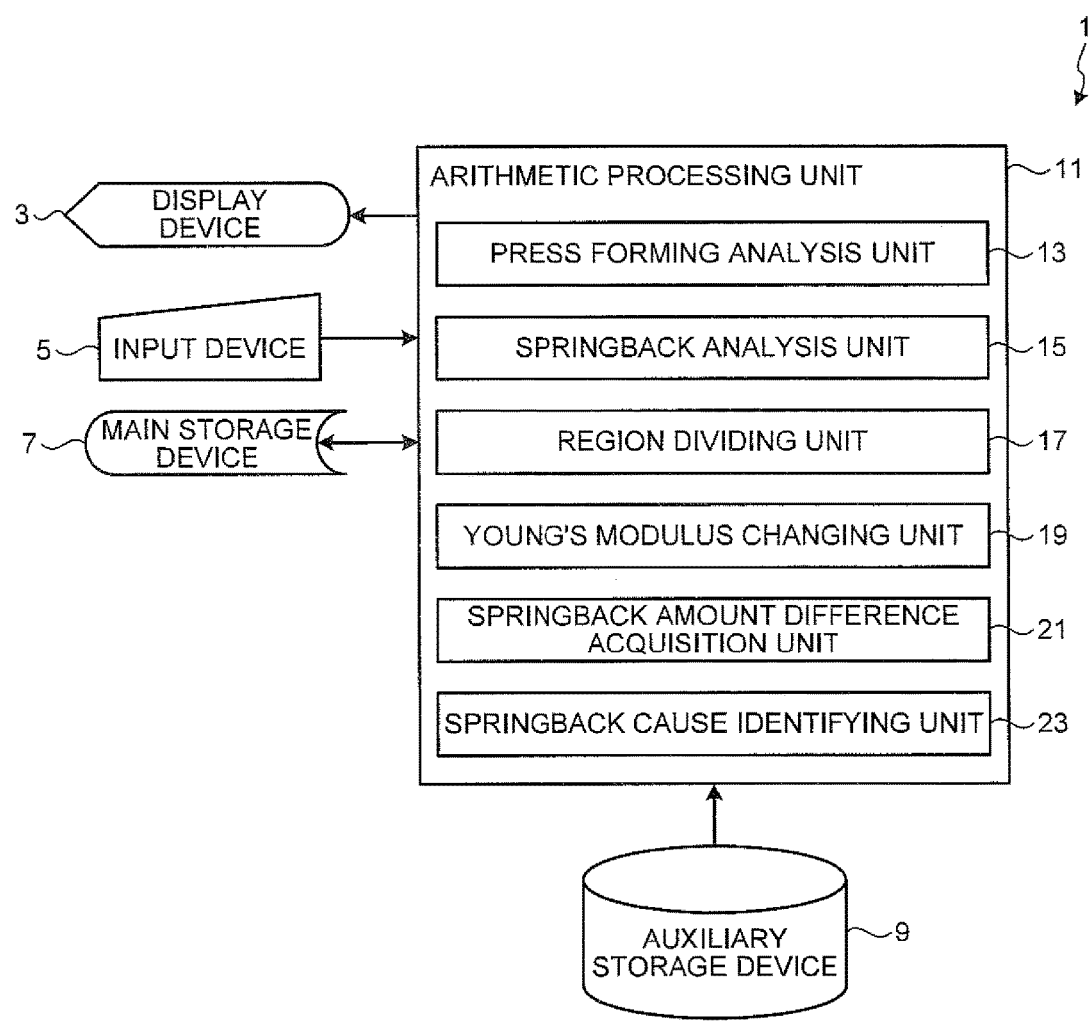
FIG. 2 is an explanatory diagram explaining a springback cause identifying apparatus that performs the method of identifying a cause of springback of FIG. 1.

As illustrated in FIG. 2, the springback cause identifying apparatus 1, which is structured by a PC and the like, includes a display device 3, an input device 5, a main storage device 7, an auxiliary storage device 9, and an arithmetic processing unit 11. The display device 3, the input device 5, the main storage device 7, and the auxiliary storage device 9 are connected to the arithmetic processing unit 11. The display device 3, the input device 5, the main storage device 7, and the auxiliary storage device 9 perform the respective functions in accordance with the commands from the arithmetic processing unit 11. The display device 3, which is used for displaying calculation results, is structured by a liquid crystal monitor and the like. The input device 5, which is used for operator's input operation and the like, is structured by a keyboard, a mouse, and the like.

The main storage device 7, which is used for temporarily storing data used by and for the arithmetic operation performed by the arithmetic processing unit 11, is structured by a RAM and the like. The auxiliary storage device 9, which is used for storing data and the like, is structured by a hard disc drive and the like. The arithmetic processing unit 11, which is structured by a CPU and the like of the PC and the like, includes a press forming analysis unit 13, a springback analysis unit 15, a region dividing unit 17, a Young's modulus changing unit 19, a springback amount difference acquisition unit 21, and a springback cause identifying unit 23. Those units are achieved by the CPU and the like executing a predetermined program. The following describes these units in detail.

<Press Forming Analysis Unit>

The press forming analysis unit 13 performs the press forming analysis on the press forming product and acquires shape information, a stress distribution, and a strain distribution after the press forming (before the die release).

<Region Dividing Unit>

Figure 3A:
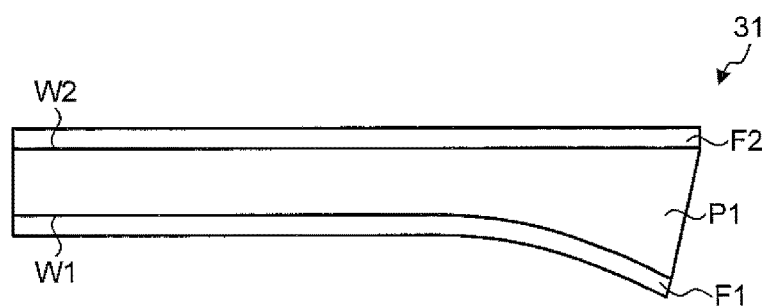
FIGS. 3A and 3B are explanatory diagrams explaining a press forming product serving as an analysis target according to the embodiment.
Figure 3B:
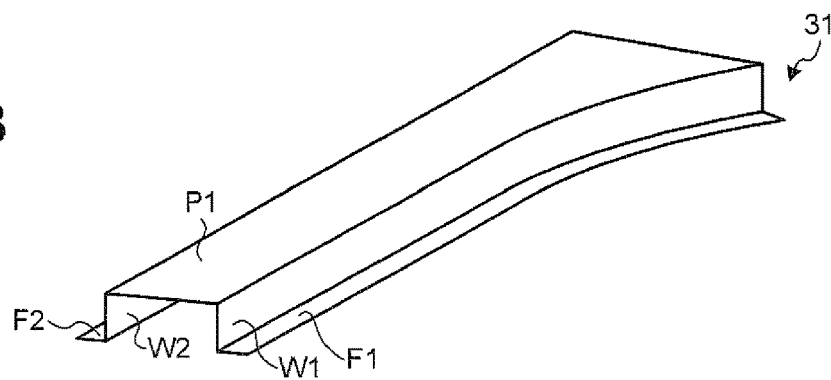
Figure 4A:
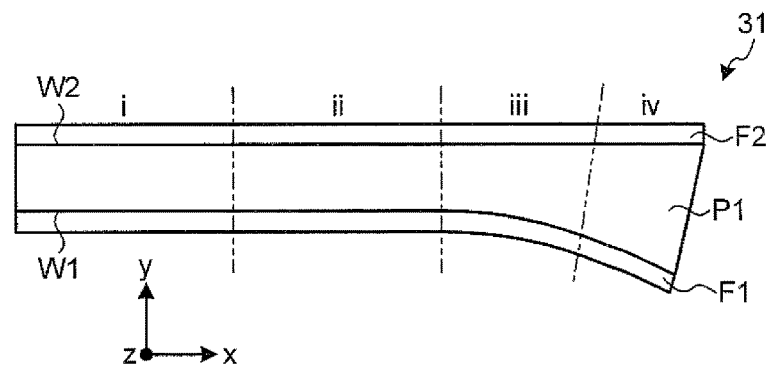
FIGS. 4A and 4B are explanatory diagrams explaining a region dividing unit of the springback cause identifying apparatus of FIG. 2.
Figure 4B:
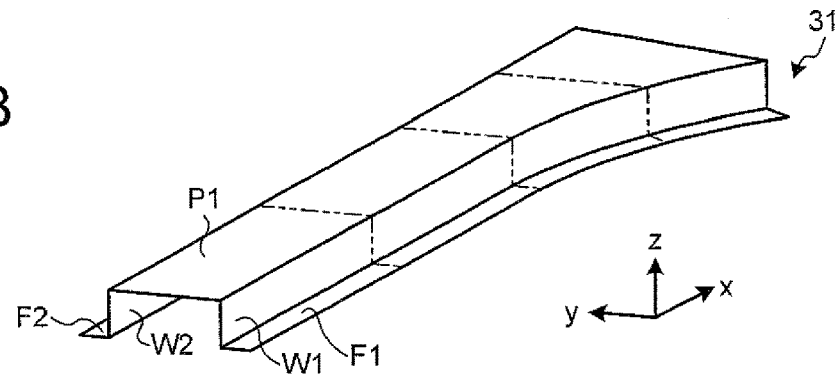

The region dividing unit 17 divides the shape of the press forming product into a plurality of regions. The description is made using an example where the region division is performed on a hat-shaped cross section part 31 as illustrated in FIG. 3. FIG. 3A is a plan view of the hat-shaped cross section part 31. FIG. 3B is a perspective view of the hat-shaped cross section part 31. FIG. 4 illustrates an example of the region division of the hat-shaped cross section part 31. As illustrated in FIG. 4, the hat-shaped cross section part 31 is divided into five regions of a flange section F1, a vertical wall section W1 (refer to FIG. 4B), a punch bottom section P1, a vertical wall section W2 (refer to FIG. 4B), and a flange section F2, in the order from the lower side in FIG. 4A for respective portions, and furthermore, the respective regions are divided into four regions of regions i to iv in the longitudinal direction in the order from the left side in FIG. 4A, so that the hat-shaped cross section part 31 is divided into 20 regions in total. In the following description, the region i of the punch bottom section P1 is described as the region P1-$i$, for example.

<Springback Analysis Unit>

Figure 5A:
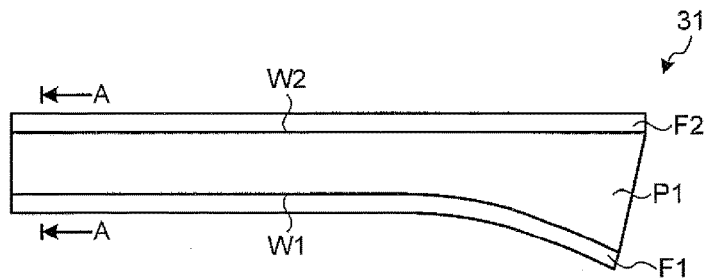
FIGS. 5A and 5B are explanatory diagrams explaining a springback analysis unit of the springback cause identifying apparatus of FIG. 2.
Figure 5B:
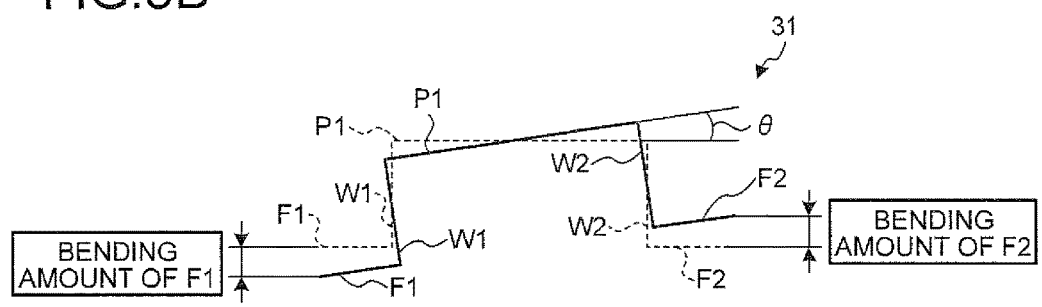

The springback analysis unit 15 performs the springback analysis on the basis of the shape information, the stress distribution, and the strain distribution before the die release obtained by the press forming analysis unit 13, and given physical property values, and acquires the springback amount after the die release. As for the springback amount, an angle (torsion angle θ (°)) is exemplified that is made between the punch bottom section P1 of the hat-shaped cross section part 31 before the die release (indicated with the broken line in FIG. 5B) and the punch bottom section P1 of the hat-shaped cross section part 31 after the die release (indicated with the solid line in FIG. 5B) in an evaluation cross-sectional surface (A-A section in FIG. 5A), which is the cross-section surface in the vicinity of the end portion of the hat-shaped cross section part 31 as illustrated in FIG. 5A. A large torsion angle θ (°) means that torsion in the evaluation cross-sectional surface is large. Although, the cross-sectional surface in the vicinity of the end portion is set as the evaluation cross-sectional surface as described above, the cross-sectional surface of another portion may be set as the evaluation cross-sectional surface. Although, the torsion angle is exemplified as the springback amount as described above, outward bending amounts of the flange sections F1 and F2 may be used as the springback amounts, for another example.

<Young's Modulus Changing Unit>

The Young's modulus changing unit 19 uses a part of the regions divided by the region dividing unit 17 as an elastic anisotropic material model and changes the Young's modulus only in a designated direction out of the directions. The following describes an example of formalization of the elastic isotropy because the elastic anisotropic material model is used in the invention. When the relation between stress σ and strain ε is represented by ε=Cσ, an elastic compliance C with consideration of elastic isotropy is expressed by the following formula (1).

$$C = \begin{bmatrix} \frac{1}{E_{xx}} & -\frac{v_{yx}}{E_{yy}} & -\frac{v_{zx}}{E_{zz}} & 0 & 0 & 0 \\ -\frac{v_{xy}}{E_{xx}} & \frac{1}{E_{yy}} & -\frac{v_{zy}}{E_{zz}} & 0 & 0 & 0 \\ -\frac{v_{xz}}{E_{xx}} & -\frac{v_{yz}}{E_{yy}} & \frac{1}{E_{zz}} & 0 & 0 & 0 \\ 0 & 0 & 0 & \frac{1}{2G_{xy}} & 0 & 0 \\ 0 & 0 & 0 & 0 & \frac{1}{2G_{yz}} & 0 \\ 0 & 0 & 0 & 0 & 0 & \frac{1}{2G_{zx}} \end{bmatrix} \quad (1)$$

where $G_{xy}$: shearing modulus in the xy plane $G_{yz}$: shearing modulus in the yz plane $G_{zx}$: shearing modulus in the zx plane $v_{xy}$: Poisson's ratio in the x direction and the y direction $v_{yz}$: Poisson's ratio in the y direction and the z direction $v_{zx}$: Poisson's ratio in the z direction and the x direction The suffix x indicates a zero-degree direction with respect to a rolling direction. The suffix y indicates a 90-degree direction with respect to the rolling direction (width direction). The suffix z indicates a thickness direction. The Young's modulus ($E_{xx}$, $E_{yy}$, and $E_{zz}$) in the x, y, and z directions, the shearing modulus ($G_{xy}$, $G_{yz}$, and $G_{zx}$) in the xy, yz, and zx planes, and the Poisson's ratios ($v_{xy}$, $v_{yz}$, and $v_{zx}$), 12 physical quantities in total, are obtained by the following formulas (2) to (6) using four input parameters: the Young's modulus $E_0$ (=$E_{180}$), $E_{45}$, and $E_{90}$ in three directions in the plane, and the Poisson's ratio $\theta_{xy}$.

$$E_{zz} = \frac{1}{3}(E_0 + E_{45} + E_{90}) \quad (2)$$

$$v_{yz} = v_{zx} = v_{xy} \quad (3)$$

$$G_{xy} = \frac{E_0}{2\left(v_{xy} - \frac{1}{2} - \frac{E_0}{2E_{90}} + \frac{2E_0}{E_{45}}\right)} \quad (4)$$

$$G_{yz} = G_{zx} = G_{xy} \quad (5)$$

$$\frac{v_{ij}}{E_{ii}} = \frac{v_{ji}}{E_{jj}} (i, j = x, y, z) \quad (6)$$

Formulas (1) to (6) enable a material model having elastic isotropy to be used. The usage of the material model having elastic isotropy allows the respective values of the Young's modulus ($E_{xx}$, $E_{yy}$, and $E_{zz}$) in the formulas to be changed to any values. For example, the value of Young's modulus $E_{xx}$ alone can be changed by a factor of 10. Changing the Young's modulus in a designated direction to a value larger or smaller than the value of the Young's modulus in another direction makes it possible to examine the influence of the residual stress in the designated direction on springback. Although, the shearing modulus ($G_{xy}$, $G_{yz}$, and $G_{zx}$) is taken into account in formula (1), a formula may be used in which only the Young's modulus ($E_{xx}$, $E_{yy}$, and $E_{zz}$) is taken into account.

Figure 6A:
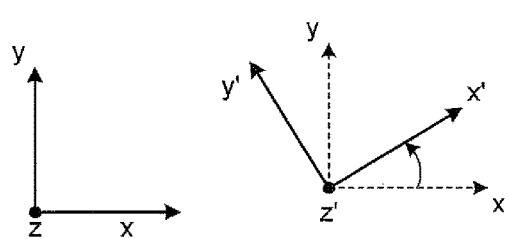
FIGS. 6A to 6C are explanatory diagrams explaining a Young's modulus changing unit of the springback cause identifying apparatus of FIG. 2.

The following three methods are exemplified as the method of designating a direction in which the Young's modulus is changed (refer to FIG. 6). A first method, as illustrated in FIG. 6A, designates any of the zero-degree direction (x direction), a 45-degree direction, the 90-degree direction (y direction) and the thickness direction (z direction or direction perpendicular to FIG. 6A) of a material coordinate system using the coordinates of the material coordinate system as the coordinate system without any change, and changes the Young's modulus in the designated direction. As an example of the method illustrated in FIG. 6A, a Young's modulus distribution in a plane is illustrated in FIG. 7 where only the Young's modulus $E_0$ (=$E_{180}$) in the zero-direction (x direction) is increased five times (205 GPa×5=1025 GPa) as large as the Young's modulus in the 45-degree direction and the 90-degree direction ($E_{45}$ and $E_{90=205}$ GPa).

In the first method, any of the zero-degree direction (x direction), the 45-degree direction, the 90-degree direction (y direction) and the thickness direction of the material coordinate system is designated. A direction other than these directions needs to be designated in some cases, such as a 30-degree direction or a 15-degree direction. In such cases, as illustrated in FIG. 6B, the material coordinate system is rotated such that the x direction of the material coordinate system coincides with a direction to be designated so as to use the rotated material coordinate system as the coordinate system, and then any of the zero-degree direction (x direction), the 45-degree direction, the 90-degree direction (y direction) and the thickness direction (z direction) of the material coordinate system is designated (a second method).

Figures 6B, 6C:
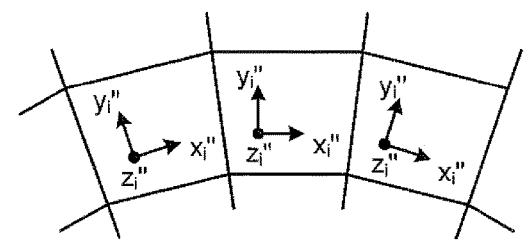
Figure 7:
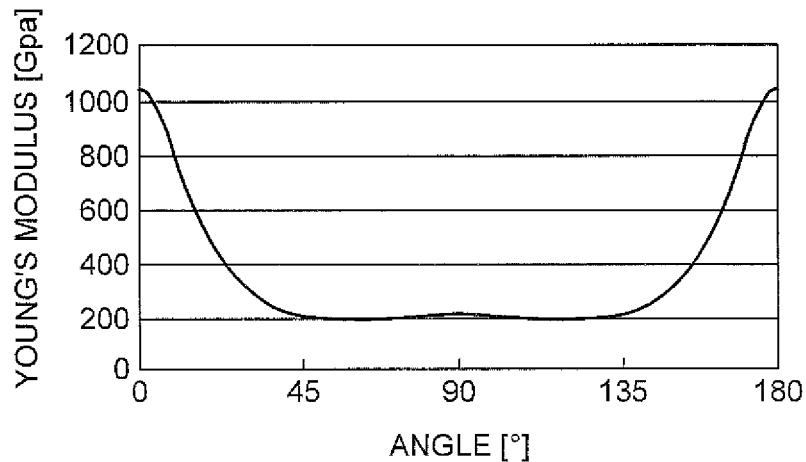
FIG. 7 is an explanatory diagram explaining an example of an implementation result of the Young's modulus changing unit of the springback cause identifying apparatus of FIG. 2.

A third method, as illustrated in FIG. 6C, designates any of the zero-degree direction (x" direction), the 45-degree direction, the 90-degree direction (y" direction) and the thickness direction (z direction), for each element, of the coordinate system determined by the shape and the direction of the element. Any of the first to the third methods can be used.

<Springback Amount Difference Acquisition Unit>

The springback amount difference acquisition unit 21 acquires the springback amount difference by comparing the springback analysis result performed without changing the Young's modulus and the springback analysis result performed by the Young's modulus changing unit 19 with the change of the Young's modulus.

<Springback Cause Identifying Unit>

The springback cause identifying unit 23 compares the multiple springback amount differences obtained by the springback amount difference acquisition unit 21 with each other and identifies the region of the residual stress and its direction having caused the springback on the basis of the comparison result. The springback cause identifying unit 23 may compare the springback amount differences with each other and identify the selected region and the designated direction from which a maximum springback amount difference is acquired as the region of the residual stress and its direction having caused the springback, for example.

[Method of Identifying a Cause of Springback]

Figure 1:
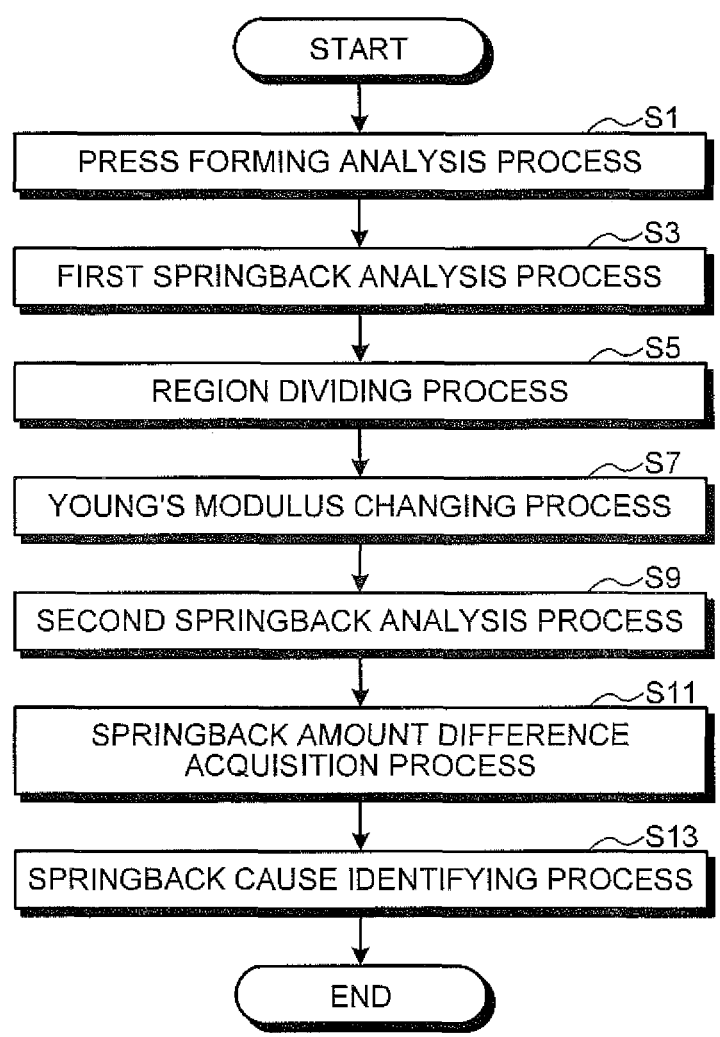
FIG. 1 is a flowchart explaining a flow of processing of a method of identifying a cause of springback according to an embodiment of the invention.

The following describes a flow of processing of a method of identifying a cause of springback using the springback cause identifying apparatus 1 thus structured in the embodiment on the basis of the flowchart illustrated in FIG. 1 appropriately with reference to necessary drawings. In the following description, the hat-shaped cross section part 31 illustrated in FIG. 3 is cited as an example of the press forming product serving as the analysis target.

<Press Forming Analysis Process S1>

The press forming analysis unit 13 first acquires the shape, the residual stress distribution, and the strain distribution of the press forming product before the die release.

<First Springback Analysis Process S3>

The springback analysis unit 15 then performs the springback analysis on the basis of the shape, the residual stress distribution, and the strain distribution of the press forming product before the die release, which are acquired at the press forming analysis process S1, and acquires the springback amount after the die release. The springback analysis unit 15 performs the analysis using the isotropic Young's modulus. In the embodiment, the springback analysis unit 15 acquires the torsion angle $\theta$ (°), which is described with reference to FIG. 5B, as the springback amount. The torsion angle acquired at this step is denoted as $\theta_A$ (°).

<Region Dividing Process S5>

The region dividing unit 17 then divides the shape, which is acquired at the press forming analysis process S1, of the press forming product into a plurality of shapes. In the embodiment, the region dividing unit 17 divides the hat-shaped cross section part 31 into 20 regions as illustrated in FIG. 4, for example.

<Young's Modulus Changing Process S7>

The Young's modulus changing unit 19 then selects any region out of the regions, which are divided at the region dividing process S5, of the press forming product and changes the Young's modulus in a designated direction in the selected region. This results in the press forming product having elastic isotropy. In the embodiment, the Young's modulus changing unit 19 designates the x direction illustrated in FIG. 6A as the direction in which the Young's modulus is changed and the Young's modulus $E_{xx}$ in the designated direction is increased by a factor of 2.

<Second Springback Analysis Process S9>

The springback analysis unit 15 then acquires the springback amount of the press forming product after the die release for each selected region and designated direction by performing the springback analysis on the press forming product whose Young's modulus is changed at the Young's modulus changing process S7 on the basis of the shape, the residual stress distribution, and the strain distribution of the press forming product that are acquired at the press forming analysis process S1. In the embodiment, the springback analysis unit 15 acquires torsion angles $\theta_B$ (°) as the springback amounts, for example.

<Springback Amount Difference Acquisition Process S11>

The springback amount difference acquisition unit 21 then compares the springback amount acquired at the first springback analysis process S3 with the springback amounts of the respective selected regions and designated directions acquired at the second springback analysis process S9, and acquires the springback amount differences of the respective selected regions and designated directions. In the embodiment, the springback amount difference acquisition unit 21 compares the torsion angle $\theta_A$ (°) obtained at the first springback analysis process S3 with the torsion angles $\theta_B$ (°) of the respective selected regions and designated directions obtained at the second springback analysis process S9, and acquires the torsion angle differences (°) of the respective selected regions and designated directions.

<Springback Cause Identifying Process S13>

The springback cause identifying unit 23 then compares all of the springback amount differences acquired at the springback amount difference acquisition process S11 with each other, and identifies the selected region and the designated direction from which a maximum springback amount difference is acquired as the region of the residual stress and its direction having caused the springback.

In the embodiment, the residual stress is not changed but the shape of the press forming product is divided into a plurality of regions and the Young's modulus is changed in the designated direction in any region, as described above. This enables the analysis of pressing a material having isotropic property to be performed closer to reality, thereby enabling the portion having the residual stress having caused the occurrence of springback and the direction of the residual stress to be accurately identified without causing a crash in calculation or performing wrong calculation.

Example

A specific experiment was carried out to confirm the operations and effects of the method of identifying a cause of springback in the embodiment. The results are described below. In the experiment, the hat-shaped cross section part 31 is used as the analysis target in the same manner as the embodiment described above and the region and the direction of the residual stress are acquired by the method of identifying a cause of springback in the embodiment (an example of the invention). The press forming material was a 980 MPa class high-strength steel sheet having a thickness of 1.2 mm. A universal finite element method software LS-DYNA was used for the forming analysis and the springback analysis and a kinematic hardening material model was used as the material model. In the Young's modulus changing process, the changing ratio of the Young's modulus was three types, 2 times, 10 times, and 50 times. The analysis was performed for each changing ratio. In the springback cause identifying process, all of the acquired springback amount differences were compared with each other and the selected region and the designated direction from which a maximum springback amount difference was acquired were identified as the region of the residual stress that was the cause of springback and the direction of the residual stress.

The regions of causes of springback and the directions of the residual stresses based on a conventional method were acquired as the comparative examples. The conventional method is described below. In the conventional method, the press forming analysis is performed on the same hat-shaped cross section part 31, and the shape, the residual stress distribution, and the strain distribution of the press forming product before the die release are acquired. The springback analysis is then performed on the basis of the acquired state before the die release and a torsion angle $\theta_C$ (°) is acquired.

The springback analysis is then performed on the basis of the acquired state before the die release by setting the residual stress in the designated direction (all of or one of the x, y, z, xy, yz, zx directions of the material coordinate system) in one of the 20 regions described with reference to FIG. 4 to zero, and a torsion angle $\theta_D$ (°) is acquired. The torsion angle $\theta$ (°) is then acquired on the basis of the torsion angle $\theta_C$ (°) and the torsion angle $\theta_D$ (°). The processing thus described is performed on all of the 20 regions. A maximum torsion angle $\theta$ (°) in the torsion angles $\theta$ (°) of all regions, the region indicating the maximum torsion angle $\theta$ (°), and the designated direction in the region are acquired. The acquired region and the designated direction are identified as the causes of springback. The following Table 1 illustrates the analysis results of the examples of invention and the comparative examples.

TABLE 1

|  | Study No. | Changing ratio of physical quantity | Changed physical quantity | Non-convergence region number in analysis | Maximum torsion angle difference region | Maximum torsion angle difference (°) |
| --- | --- | --- | --- | --- | --- | --- |
| Present invention | 1 | X2 | E(x) | 0 | F1-iii | 2.8 |
|  | 2 |  | E(y) | 0 | P1-iv | 1.0 |
|  | 3 |  | E(z) | 0 | W1-iii | 0.2 |
|  | 4 | X10 | E(x) | 0 | F1-iii | 3.2 |
|  | 5 |  | E(y) | 0 | P1-iv | 1.5 |
|  | 6 |  | E(z) | 0 | W1-iii | 0.2 |
|  | 7 | X50 | E(x) | 0 | F1-iii | 3.3 |
|  | 8 |  | E(y) | 0 | P1-iv | 1.5 |
|  | 9 |  | E(z) | 0 | W1-iii | 0.2 |
| Comparative examples | 10 | X0 | σ(x), σ(y), σ(z), τ(xy), τ(yz), τ(zx) | 0 | W1-iii | 2.1 |

TABLE 1-continued

| Study No. | Changing ratio of physical quantity | Changed physical quantity | Non-convergence region number in analysis | Maximum torsion angle difference region | Maximum torsion angle difference (°) |
|---|---|---|---|---|---|
| 11 | X0 | σ(x) | 4 | W1-iii | 2.5 |
| 12 | X0 | σ(y) | 3 | P1-iv | 2.0 |
| 13 | X0 | σ(z) | 0 | W1-iii | 0.3 |
| 14 | X0 | τ(xy) | 2 | F1-iii | 1.6 |
| 15 | X0 | τ(yz) | 0 | W1-iii | 0.8 |
| 16 | X0 | τ(zx) | 0 | F1-iii | 0.3 |

E: Young's Modulus
σ: Stress
τ: Shearing force

In Table 1, the number of non-convergence regions in analysis, a maximum in the acquired torsion angle differences (maximum torsion angle difference), and the region thereof (maximum torsion angle difference region) are listed for each changed physical quantity (Young's modulus and residual stress). In the example of the invention, the results when the Young's modulus was doubled are illustrated in studies No. 1 to 3, the results when the Young's modulus was increased by a factor of 10 are illustrated in studies No. 4 to 6, and the results when the Young's modulus was increased by a factor of 50 are illustrated in studies No. 7 to 9. The results obtained using the conventional method are illustrated in studies No. 10 to 16 as the comparative examples.

Studies No. 1 to 3 in Table 1 are described first. As illustrated in study No. 1, the maximum torsion angle difference was 2.8° in the region F1-iii when the Young's modulus $E_{xx}$ in the zero-degree direction (x direction) was doubled. As illustrated in study No. 2, the maximum torsion angle difference was 1.0° in the region P1-iv when the Young's modulus in in the 90-degree direction (y direction) was doubled in the same manner. As illustrated in study No. 3, the maximum torsion angle difference was 0.2° in the region W1-iii when the Young's modulus $E_{zz}$ in the thickness direction (z direction) was doubled. In the respective analyses, the number of non-convergence regions in analysis was zero, which means that all of the analyses were able to be converged and the analysis results were very good.

As can be seen from Table 1, the maximum springback amount difference in all of the directions in all of the regions is identified in the x direction and the region F1-iii, in studies No. 1 to 3. Thus, in the springback cause identifying process S13, the region F1-iii is identified as the region of the residual stress having caused the springback and the x direction is identified as the direction of the residual stress having caused the springback. More specifically, the residual stress in the x direction in the region F1-iii is identified as the cause of the springback.

As illustrated in studies No. 4 to 6 and studies No. 7 to 9 in Table 1, the region identified as the cause of the springback and the direction of the residual stress were the same (the residual stress in the x direction in the region F1-iii) when the changing ratio of the Young's modulus was changed.

The comparative examples are described below. As illustrated in study No. 11 in Table 1, the number of non-convergence regions in analysis (non-convergence region number) was four when the analysis was performed by setting the residual stress in the x direction to zero in each of the 20 regions. It is conceivable that consistency in calculation was not maintained by setting the residual stress in the x direction to zero in the non-convergence regions and the calculation crashed. The non-convergence regions were also present in studies No. 12 and 14. In Table 1, the maximum torsion angle differences are selected from the regions in which the analysis was converged in disregard of the non-convergence regions. Thus, the analysis results have low reliability.

As can be seen from Table 1, the maximum torsion angle difference (°) in studies No. 10 to 16 was 2.5° when the residual stress in the x direction in the region W1-iii was set to zero (study No. 11). In the conventional method, thus, the residual stress in the x direction in the region W1-iii was identified as the cause of the springback.

Figure 8:
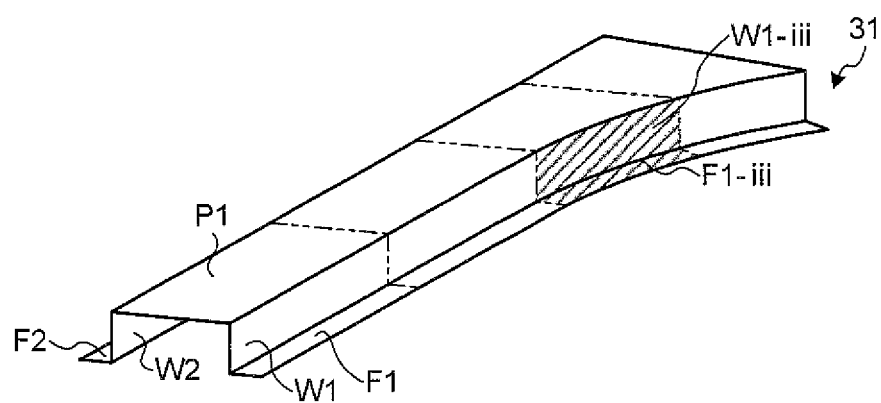
FIG. 8 is a comparison diagram for comparing an identified portion by the method of identifying a cause of springback of FIG. 1 and an identified portion by a conventional method.
Figure 9A:
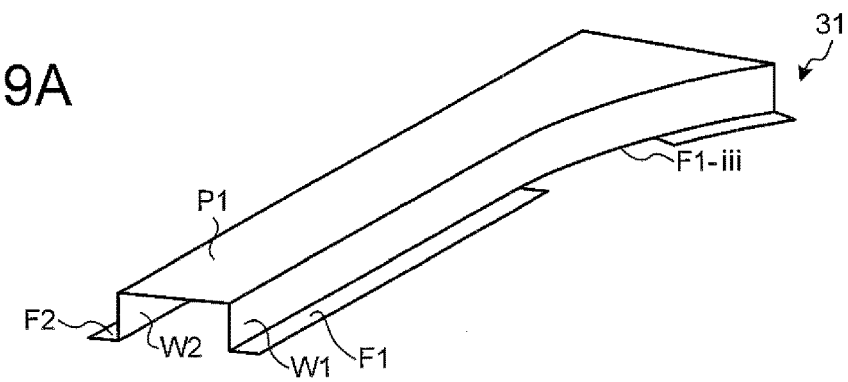
FIGS. 9A and 9B are explanatory diagrams for explaining an experiment for comparing an identified portion by the method of identifying a cause of springback of FIG. 1 and an identified portion by the conventional method.
Figure 9B:
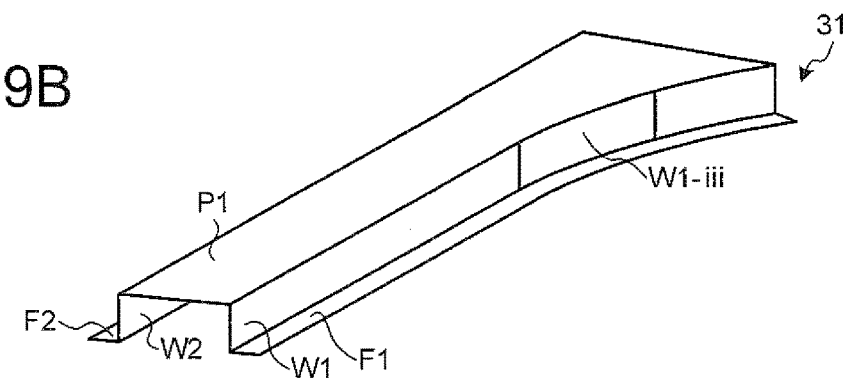

The region F1-iii (the example of the invention) identified by the invention and the region W1-iii (the comparative example) identified by the conventional method are illustrated in FIG. 8 so as to be visually understandable. In order to confirm whether either the region F1-iii (the example of the invention) or the region W1-iii (the comparative example) is appropriate to the cause of the springback, the portions corresponding to those regions of the hat-shaped cross section part 31 had been preliminarily cut off in the press forming state and then the press forming was performed. The hat-shaped cross section part 31 obtained by the press forming using the material from which the region F1-iii had been cut off is illustrated in FIG. 9A (the example of the invention). The hat-shaped cross section part 31 obtained by the press forming using the material from which the region W1-iii had been cut off (W1-iii had become a space) is illustrated in FIG. 9B (comparative example 1).

Figure 10:
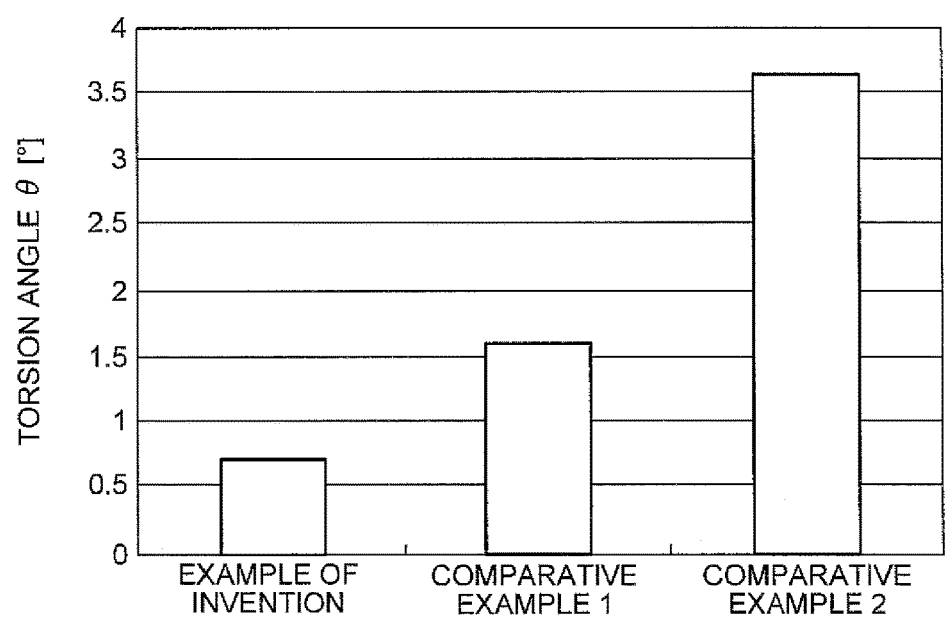
FIG. 10 is an explanatory diagram explaining the result of the comparison experiment of FIG. 9.
Figure 11:
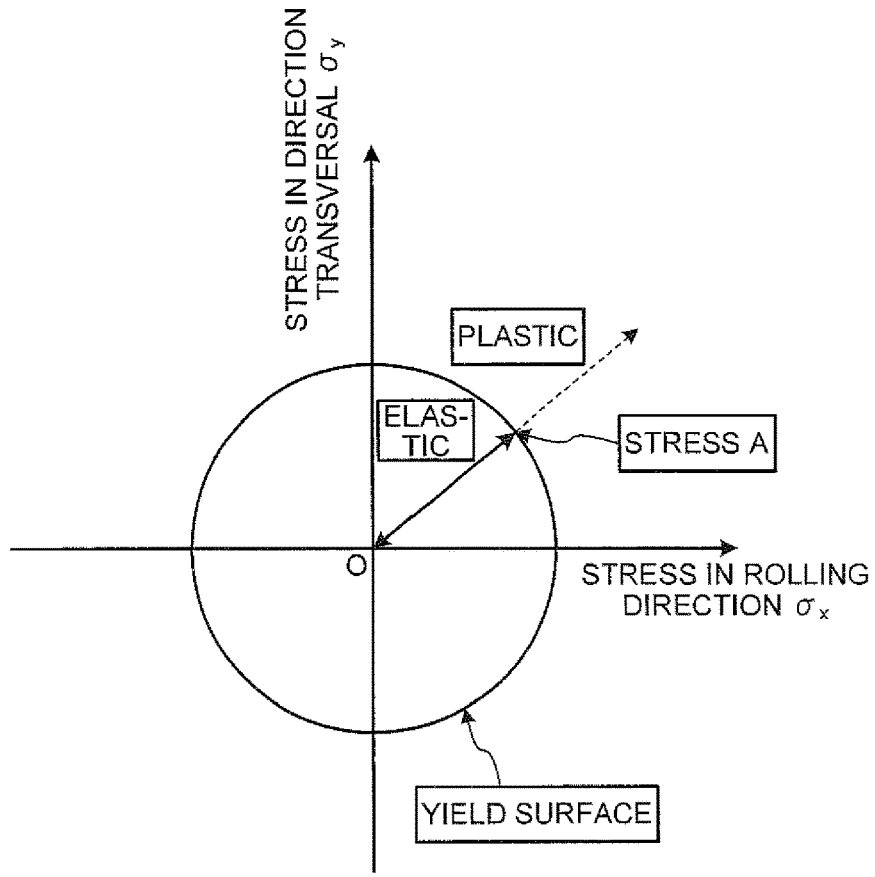
FIG. 11 is an explanatory diagram for explaining a background art, explaining a yield surface.
Figure 12:
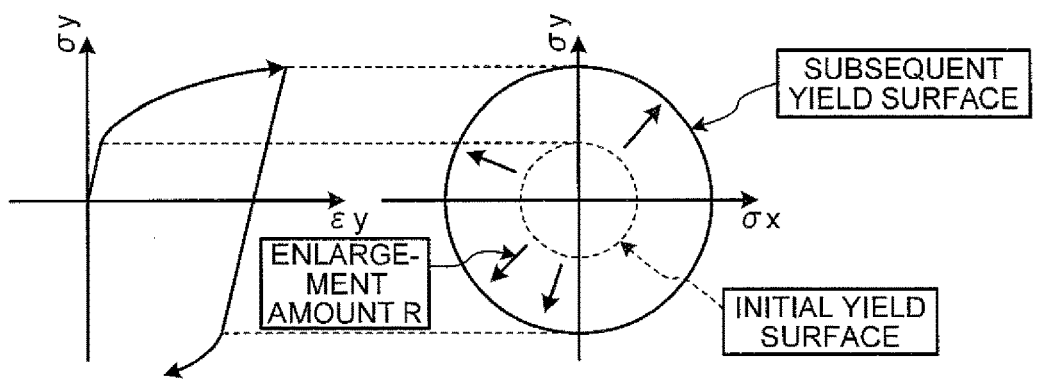
FIG. 12 is an explanatory diagram for explaining a background art, explaining a material model (isotropic hardening model) that defines deformation behaviors of a material in a simulation.
Figure 13:
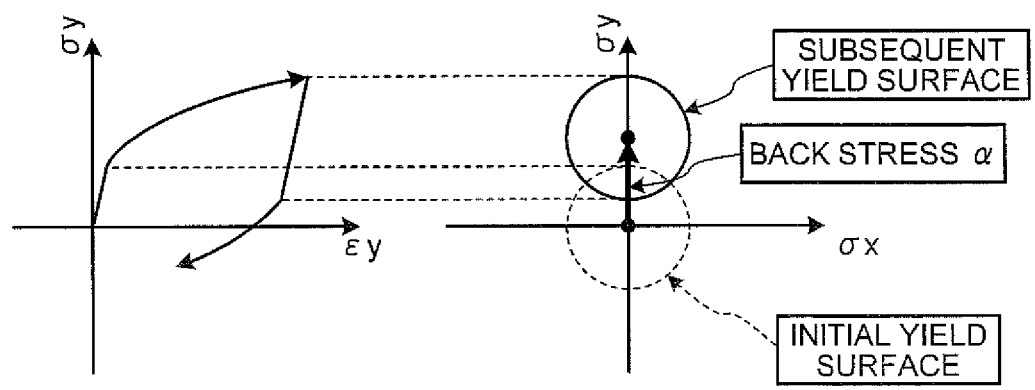
FIG. 13 is an explanatory diagram explaining a material model (kinematic hardening model) different from the material model (isotropic hardening model) of FIG. 12.

The torsion angle of the hat-shaped cross section part 31 is illustrated in FIG. 10. In FIG. 10, for comparison, the torsion angle of the hat-shaped cross section part 31 obtained by the press forming using the material on which no springback action has been performed (no material had been cut off) is illustrated as comparative example 2.

As illustrated in FIG. 10, the torsion angle θ of the comparative example 2 was 3.7°. In contrast, the torsion angle θ of the comparative example 1 was 1.6°. A certain degree of springback suppression effect was found in the conventional method. The torsion angle θ of the example of the invention was mere 0.7°. A very effective springback suppression effect was obtained.

The results verified that the method of identifying a cause of springback of the invention enables the portion having the residual stress and its direction having caused the springback to be more accurately identified.

In addition, the method can converge the analysis without the occurrence of mismatching in calculation during the analysis and thus obtain the springback amount differences in all of the regions and all of the directions, thereby achieving high reliability in the analysis results.

The embodiment to which the invention made by the inventors is applied has been described above. The invention is not limited by the description and the drawings, which constitute the disclosure of the invention, of the embodiment. That is, other embodiments, examples, and operation techniques carried out by persons skilled in the art on the basis of the embodiment are all included in the scope of the invention.

INDUSTRIAL APPLICABILITY

The invention can accurately identify the portion having the residual stress having caused the occurrence of springback and the direction of the residual stress without causing a crash in calculation or performing wrong calculation.

REFERENCE SINGS LIST

F1, F2 flange section
W1, W2 vertical wall section
P1 punch bottom section
1 springback cause identifying apparatus
3 display device
5 input device
7 main storage device
9 auxiliary storage device
11 arithmetic processing unit
13 press forming analysis unit
15 springback analysis unit
17 region dividing unit
19 Young's modulus changing unit
21 springback amount difference acquisition unit
23 springback cause identifying unit
31 hat-shaped cross section part

The invention claimed is:

1. A method of identifying a cause of springback of a press forming product, the method comprising:
a press forming analysis step of acquiring a shape, a residual stress distribution, and a strain distribution of the press forming product before the press forming product is released from a die;
a first springback analysis step of acquiring a springback amount of the press forming product after the press forming product is released from the die, the first springback analysis being based on the shape, the residual stress distribution, and the strain distribution of the press forming product;
a region dividing step of dividing the shape of the press forming product into a plurality of regions;
a Young's modulus changing step of selecting a first region of the plurality of regions and changing the Young's modulus and a designated direction of the first region;
a second springback analysis step of acquiring the springback amount of the press forming product for each of the plurality of regions including the first region, the second springback analysis being performed after the press forming product is released from the die for each region for each designated direction changed in the Young's modulus changing step with regard to the plurality of regions including the first region and after the Young's modulus changing step, the second springback analysis step being based on the shape, the residual stress distribution, and the strain distribution of the press forming product;
a springback amount difference acquisition step of acquiring springback amount differences for each region for each designated direction by comparing the springback amount acquired at the first springback analysis step with each springback amount for each region for each designated direction acquired at the second springback analysis step; and
a springback cause identifying step of comparing the springback amount differences with each other for all of the plurality of regions and the designated directions, and, based on the comparison, identifying a region of the plurality of regions and a direction as having caused the springback, the identified region and the direction having a maximum springback amount difference,
wherein, when a relation between a stress σ and a strain ε is expressed by ε=Cσ and where $E_{xx}$ is the Young's modulus in an x direction, $E_{yy}$ is the Young's modulus in a y direction, and $E_{zz}$ the Young's modulus in a z direction at the Young's modulus changing step and the second springback analysis step, an elastic compliance C is given by the following formula (1):

$$C = \begin{bmatrix} \frac{1}{E_{xx}} & -\frac{v_{yx}}{E_{yy}} & -\frac{v_{zx}}{E_{zz}} & 0 & 0 & 0 \\ -\frac{v_{xy}}{E_{xx}} & \frac{1}{E_{yy}} & -\frac{v_{zy}}{E_{zz}} & 0 & 0 & 0 \\ -\frac{v_{xz}}{E_{xx}} & -\frac{v_{yz}}{E_{yy}} & \frac{1}{E_{zz}} & 0 & 0 & 0 \\ 0 & 0 & 0 & \frac{1}{2G_{xy}} & 0 & 0 \\ 0 & 0 & 0 & 0 & \frac{1}{2G_{yz}} & 0 \\ 0 & 0 & 0 & 0 & 0 & \frac{1}{2G_{zx}} \end{bmatrix} \quad (1)$$

where $G_{xy}$ is the shearing modulus in the xy plane, $G_{yz}$ is the shearing modulus in the yz plane, $G_{zx}$ is the shearing modulus in the zx plane, $v_{xy}$ is the Poisson's ratio in the x direction and the y direction, $v_{yz}$ is the Poisson's ratio in the y direction and the z direction, and $v_{zx}$ is the Poisson's ratio in the z direction and the x direction, and
the Young's modulus in the designated direction is changed at the Young's modulus changing step by changing a value of any of $E_{xx}$, $E_{yy}$, and $E_{zz}$ of formula (1).

2. The method of identifying a cause of springback according to claim 1, wherein the Young's modulus in the designated direction is changed at the Young's modulus changing step by increasing the value of any of $E_{xx}$, $E_{yy}$, and $E_{zz}$ of formula (1) by a factor of equal to or larger than 2 or by a factor of equal to or smaller than ½.

3. An apparatus of identifying a cause of springback of a press forming product, the apparatus comprising:
a press forming analysis unit that acquires a shape, a residual stress distribution, and a strain distribution of the press forming product before the press forming product is released from a die;
a first springback analysis unit that acquires a springback amount of the press forming product after the press forming product is released from the die, the springback amount being based on the shape, the residual stress distribution, and the strain distribution of the press forming product;
a region dividing unit that divides the shape of the press forming product into a plurality of regions;

a Young's modulus changing unit that selects a first region of the plurality of regions and changes the Young's modulus and a designated direction of the first region;

a second springback analysis unit that acquires springback amounts of the press forming product for each of the plurality of regions including the first region, the second springback analysis being performed after the press forming product is released from the die for each region for each designated direction changed in the Young's modulus changing step with regard to the plurality of regions including the first region and after the Young's modulus changing unit changes the Young's modulus of the first region, the springback amounts being based on the shape, the residual stress distribution, and the strain distribution of the press forming product;

a springback amount difference acquisition unit that acquires springback amount differences for each region for each designated direction by comparing the springback amount acquired by the first springback analysis unit with each springback amount for each region for each designated direction acquired by the second springback analysis unit; and a springback cause identifying unit that compares the springback amount differences with each other for all of the plurality of regions and the designated directions, and, based on the comparison, identifies a region of the plurality of regions and a direction as having caused the springback, the identified region and the direction having a maximum springback amount difference, wherein, when a relation between a stress 6 and a strain c is expressed by c=C6 and where $E_{xx}$ is the Young's modulus in an x direction, Eyy is the Young's modulus in a y direction, and $E_z$ is the Young's modulus in a z direction in the Young's modulus changing unit and the springback analysis unit, an elastic compliance C is given by the following formula (1):

$$C = \begin{bmatrix} \frac{1}{E_{xx}} & -\frac{v_{yx}}{E_{yy}} & -\frac{v_{zx}}{E_{zz}} & 0 & 0 & 0 \\ -\frac{v_{xy}}{E_{xx}} & \frac{1}{E_{yy}} & -\frac{v_{zy}}{E_{zz}} & 0 & 0 & 0 \\ -\frac{v_{xz}}{E_{xx}} & -\frac{v_{yz}}{E_{yy}} & \frac{1}{E_{zz}} & 0 & 0 & 0 \\ 0 & 0 & 0 & \frac{1}{2G_{xy}} & 0 & 0 \\ 0 & 0 & 0 & 0 & \frac{1}{2G_{yz}} & 0 \\ 0 & 0 & 0 & 0 & 0 & \frac{1}{2G_{zx}} \end{bmatrix} \quad (1)$$

where Gxy is the shearing modulus in the xy plane, Gyz is the shearing modulus in the yz plane, Gzx is the shearing modulus in the zx plane, vxy is the Poisson's ratio in the x direction and the y direction, vyz is the Poisson's ratio in the y direction and the z direction, and vzx is the Poisson's ratio in the z direction and the x direction, and the Young's modulus in the designated direction is changed by the Young's modulus changing unit by changing a value of any of Exx, Eyy, and Ezz of formula (1).

4. The apparatus of identifying a cause of springback according to claim 3, wherein the Young's modulus changing unit changes the Young's modulus in the designated direction by increasing the value of any of $E_{xx}$, $E_{yy}$, and $E_{zz}$ of formula (1) by a factor of equal to or larger than 2 or by a factor of equal to or smaller than ½.

\* \* \* \* \*